Figure 1:
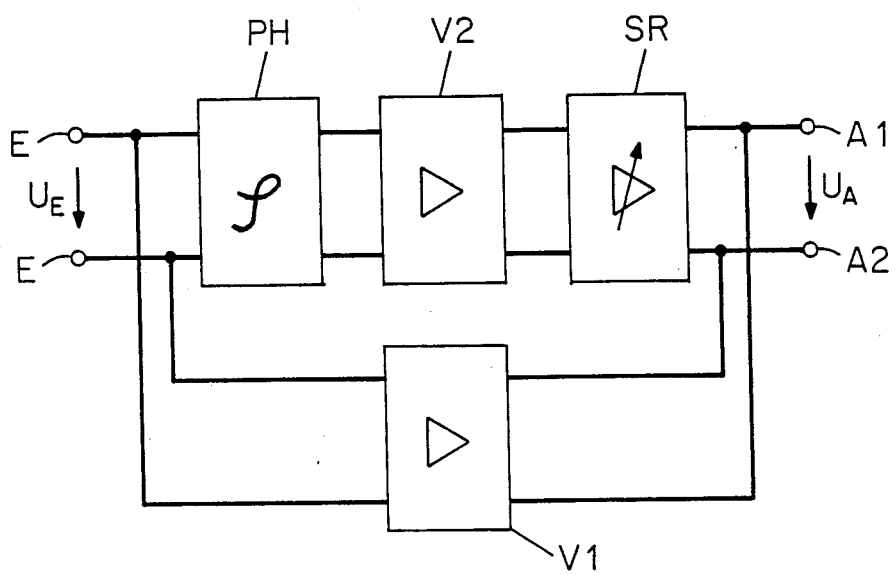

United States Patent [19]
Antoine

[11] Patent Number: 4,792,744
[45] Date of Patent: Dec. 20, 1988

[54] ARRANGEMENT FOR SHIFTING THE PHASE OF A SIGNAL PASSED THROUGH TWO PARALLEL BRANCHES WITH ONE BRANCH HAVING A PHASE SHIFTING NETWORK

[75] Inventor: Pery Antoine, Villingen-Schwenningen, Fed. Rep. of Germany

[73] Assignee: Deutsche Thomson-Brandt GmbH, Villingen, Fed. Rep. of Germany

[21] Appl. No.: 76,365

[22] Filed: Jul. 22, 1987

[30] Foreign Application Priority Data

Jul. 23, 1986 [DE] Fed. Rep. of Germany ....... 3624854

[51] Int. Cl.$^4$ ............................................. H03H 11/20
[52] U.S. Cl. .................................. 323/217; 307/511; 323/213; 328/155; 330/295; 358/28
[58] Field of Search ....................... 323/212, 213, 217; 328/155; 307/511, 513; 363/3, 4; 330/124 R, 295; 358/28

[56] References Cited

U.S. PATENT DOCUMENTS

| | | | |
|---|---|---|---|
| 3,056,921 | 10/1962 | Flarity | 323/213 |
| 3,248,663 | 4/1966 | Jacob | 330/124 R |
| 3,475,626 | 10/1969 | Holzman et al. | 307/511 |
| 4,039,930 | 8/1977 | Lukas | 323/213 |
| 4,052,679 | 10/1977 | Hosoya | 328/155 |
| 4,255,701 | 3/1981 | Geller | 323/217 |

FOREIGN PATENT DOCUMENTS 1107814 5/1961 Fed. Rep. of Germany ...... 323/213

*Primary Examiner*—William H. Beha, Jr.
*Attorney, Agent, or Firm*—Max Fogiel

[57] ABSTRACT

A circuit arrangement for shifting the phase of a signal, in which the signal is applied to two parallel branches where one branch contains a phase-shifting network for purposes of applying a constant phase shift to the signal. A variable amplifier connected in one of the two branches controls the amplitude of the signal and inverts the polarity of the signal. This variable amplifier can be connected in series with the phase-shifting network, or the ampifier can be connected in the branch that is in parallel with the branch containing the phase-shifting network.

8 Claims, 3 Drawing Sheets

ARRANGEMENT FOR SHIFTING THE PHASE OF A SIGNAL PASSED THROUGH TWO PARALLEL BRANCHES WITH ONE BRANCH HAVING A PHASE SHIFTING NETWORK

The invention concerns circuitry for shifting the phase of a signal wherein the signal is conveyed over two parallel branches and wherein one of the two branches contains a phase-shifting network.

Circuitry of this type, which is briefly called a phase shifter, is employed in color-television receivers for example to correctly evaluate the chromaticity signal and regulate the chrominance in such a way as to attain screen colors that are as natural as possible.

"RCA Solid-State Circuits Applications," Note ICAN 5, (USA, 1983) describes an integrated circuit, called ICAN 6472, for demodulating the chromaticity signal. This integrated circuit can be employed in color television receivers to demodulate chromaticity signals for example.

Chromaticity is composed of chrominance and saturation. In the NTSC color-television system chrominance is determined by the phase angle of the chromaticity signal, whereas saturation is established by the amplitude of the chrominance signal.

The ICAN 6472 integrated circuit is equipped with a chrominance-control loop to prevent adulteration of the chrominance due to undesired and uncontrollable phase shifts in the chrominance signal, which can occur at several points along the transmission path.

The chromaticity-signal demodulator illustrated in FIG. 9 on page 5 of the aforesaid publication is comprised of the chrominance-control loop. The chrominance signal, which is applied to the base of a transistor F2, arrives without phase-shifting at the base of a transistor Q4 through a branch that contains a resistor R6. In another branch, which parallels the first, the phase of the chromaticity signal is rotated $+45°$ by a phase-shifting network, a series circuit consisting of a capacitor C1 and two resistors R3 and R5. The voltage component of the $+45°$ phase-shifted chromaticity signal that decreases through resistor R3, is amplified in a differential amplifier that consists of two transistors Q2 and F3 and then decreases again at resistor R6, where the voltage component of the chromaticity signal that is un-phase-shifted and unamplified also decreases. Due to the differential amplifier that consists of transistors Q2 and F3, the amplified component of the chromaticity signal is phase shifted $-135°$ in relation to the component that is not phase shifted. The amplitude and phase relation of the voltage that decreases at resistor R6 and is supplied to the base of transistor Q4, the sum of the phase-shifted and amplified component and the un-phase-shifted component of the chromaticity signal, depends on the amplification by the differential amplifier that consists of transistors Q2 and F3 and that can be varied by means of a control voltage. If the amplification is zero, only the un-phase-shifted voltage component of the chromaticity signal will decrease at resistor R6, whereas at maximum amplification the amplitude of the voltage component of the phase-shifted chromaticity signal will be approximately 1.4 times more powerful than that of the un-phase-shifted voltage component of the chromaticity is. The voltage that decreases at resistor R6 when the amplification is maximum and that is supplied to the base of transistor Q4 is phase-shifted $-90°$.

One essential drawback to this known chrominance regulator is that its regulating range is only $+45°$ and unsymmetrical. The lack of symmetry makes it impossible to precisely define and adjust the zero phase relation.

The object of the present invention is accordingly to create a phase shifter with a regulating range that can be varied symmetrically over a wide range.

This object is attained in accordance with the invention in that one of the two branches contains means of controlling the amplitude and of inverting the mathematical sign of the signal.

Figure 2:
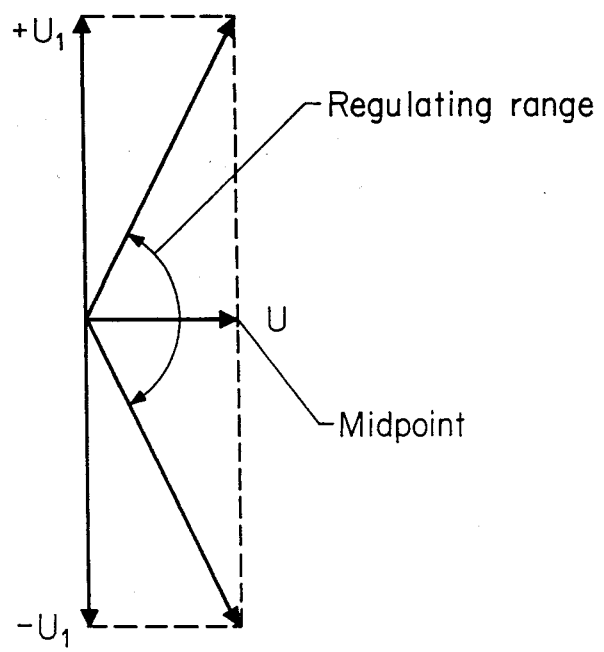
Figure 3:
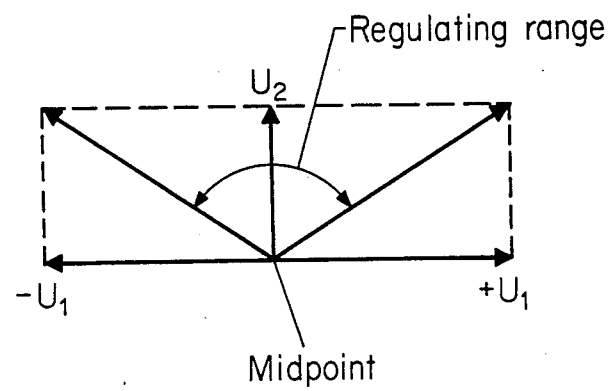
Figure 5:
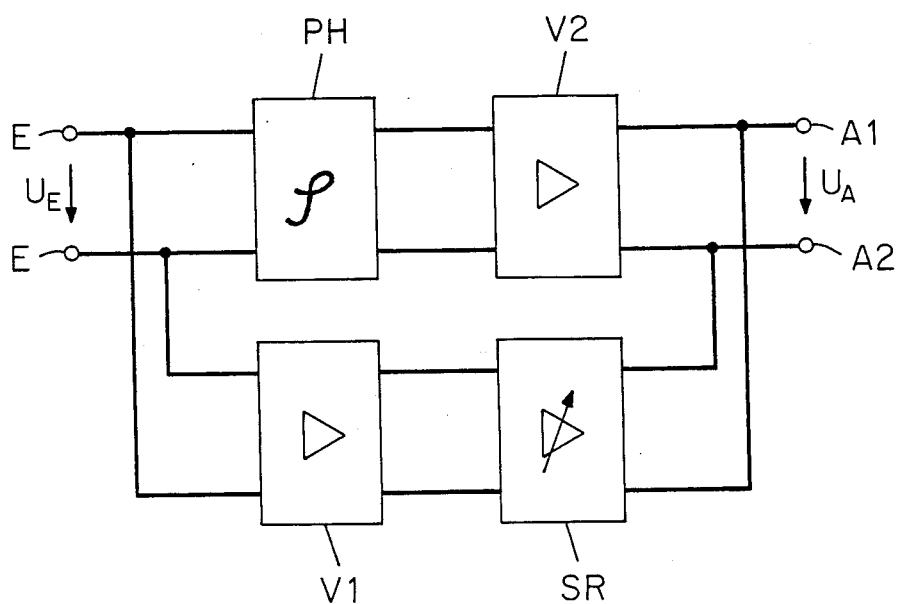
Figure 4:
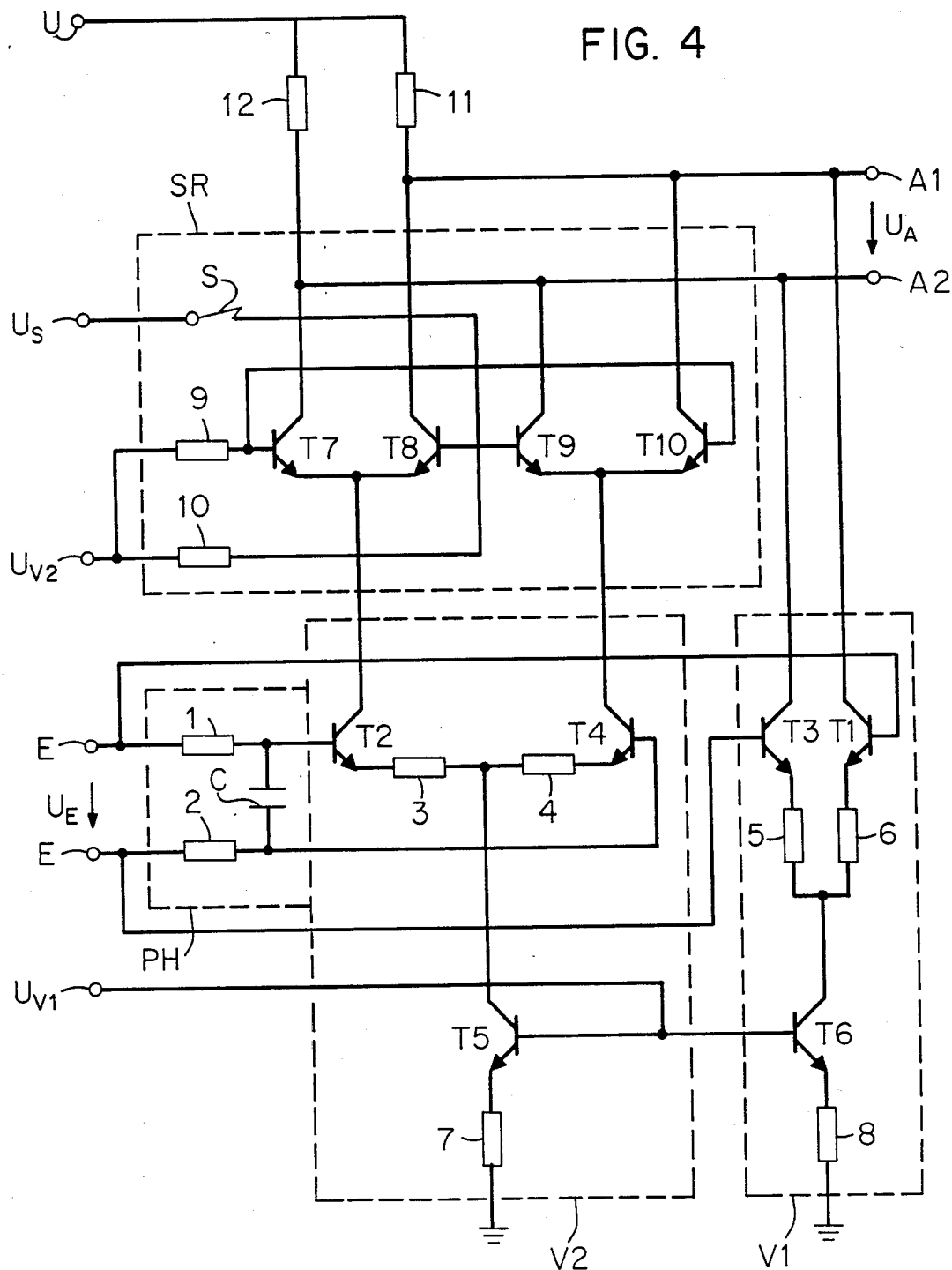

In the drawing
FIG. 1 illustrates one embodiment of the invention,
FIG. 2 is a complexor that explicates the embodiment illustrated in FIG. 1,
FIG. 3 is another complexor, and
FIG. 4 illustrates another embodiment of the invention;
FIG. 5 is a schematic view of a further embodiment in which the branch in parallel with the branch containing hte phase-shifting network has the variable amplifier for controlling amplitude and inverting the polarity of the signal.

The invention will no be specified with reference to the embodiment illustrated in FIG. 1 and to the complexor in FIG..2.

The input terminal of a phase-rotating network PH and the input terminal of an amplifier V1 are connected in parallel to the input terminal E of the phase shifter in accordance with the invention. The output terminal of phase-rotating network PH is connected to the input terminal of another amplifier V2, which has an output terminal that is connected to the input terminal of a variable amplifier SR. The parallel output terminals of variable amplifier SR and of second amplifier V1 constitute the output-terminal contacts A1 and A2 of the phase shifter. The signal path accordingly separates into two parallel branches.

An input signal $U_E$ with a phase that is to be shifted is conveyed to the input terminal E of the two branches by being supplied to the input terminal of first amplifier V1 and to the input terminal of phase-rotating network PH. It is amplified in one branch by first amplifier V1. In the other branch, however, the phase of input signal $U_E$ is rotated $+90°$ before it is amplified in second amplifier V2. Since variable amplifier SR, which is downstream of second amplifier V2, can be employed to control the amplitude and invert the mathematical sign—or in other words the polarity—of the amplified and $+90°$-phase-shifted input signal $U_E$ independently of each other, not only is the dimension of the signal at the output terminal of variable amplifier SR variable, but the mathematical sign of the signal at the output terminal of variable amplifier SR can be either the same or the opposite of that of input signal $U_E$ as desired. Thus, two signals will be superimposed at the two parallel output terminals of variable amplifier SR and of first amplifier V1, the output-terminal contacts A1 and A2 of the phase shifter—one signal amplified without phase shifting and the other signal, which has a variable dimension and an invertible mathematical sign, with a phase shift of $+90°$ in relation to input signal $U_E$.

FIG. 2 illustrates the superimposed signal at the output terminal of the phase shifter. The signal $U_2$ at the output terminal of first amplifier V1 is plotted along the abscissa. Phase shifted $+90°$ in relation to signal $U_2$, the signal $U_1$ at the output terminal of variable amplifier SR is plotted along the ordinate. Its level, which ranges from $+U_1$ to $-U_1$, can be controlled by variable amplifier SR. When, for example, the amplification in the second branch is twice as powerful as that in the first branch, the result will be a symmetrical regulating range of approximately $\pm 62°$. The regulating range can be varied as a function of the amplification in the two branches. The higher the ratio of the amplification in the second branch to that in the first branch, the longer the regulating range. A ratio of 1:1 will result in a symmetrical regulating range of $\pm 45°$, and a ratio greater than 1 will result in a regulating range of more than $\pm 45°$.

It is also possible to position variable amplifier SR in the other branch downstream of first amplifier V1. FIG. 3 is the resulting complexor.

Regulated amplifiers can also be employed instead of single-level amplifiers.

The phase shifter in accordance with the invention illustrated in FIG. 1 is, due to a symmetrical regulating range that is extensively variable, especially appropriate as a chrominance regulator in a color-television receiver.

FIG. 4 illustrates how the details of the phase shifter illustrated in FIG. 1 can be designed.

One contact of input terminal E is connected to the base of a transistor T1 and, through a resistor 1, to the base of another transistor T2. The other contact of input terminal E is connected to the base of a third transistor T3 and, through another resistor 2, to the base of a fourth transistor T4. The base of second transistor T2 is connected to the base of fourth transistor T4 through a capacitor C. The emitter of second transistor T2 is connected to the emitter of fourth transistor T4 through a series circuit that consists of a third resistor 3 and of a fourth resistor 4. The emitter of third transistor T3 is connected to the emitter of first transistor T1 through a series circuit that consists of a fifth resistor 5 and of a sixth resistor 6.

The point at which resistors 3 and 4 are connected together is connected to the collector of a fifth transistor T5, whereas the point at which resistors 5 and 6 are connected together is connected to the collector of a sixth transistor T6. The base of fifth transistor T5 is connected to the base of sixth transistor T6. The emitter of fifth transistor T5 is connected to reference potential through a seventh resistor 7, as is the emitter of sixth transistor T6, through an eighth resistor 8. The collector of second transistor T2 is connected to the mutually connected emitters of a seventh transistor T7 and of an eighth transistor T8, whereas the collector of fourth transistor T4 is connected to the mutually connected emitters of a ninth transistor T9 and of a tenth transistor T10. The base of seventh transistor T7 is connected to the base of tenth transistor T10 and the base of eighth transistor T8 to the base of ninth transistor T9. The base of seventh transistor T7 is connected to the base of eighth transistor T8 through a series circuit that consists of ninth resistor 9 and of a tenth resistor 10. The mutually connected collectors of transistors T1, T8, and T10 are connected to a supply voltage U through an eleventh resistor 11, whereas the mutually connected collectors of transistors T3, T7, and T9 are connected to supply voltage U through a twelfth resistor 12. The point where the collectors of transistors T1, T8, and T10 are connected to one another constitutes one output contact A1, whereas the other output contact A2 is constituted by the point where the collectors of transistors T3, T7, and T9 are connected one to another.

Phase-rotating network PH, which shifts the phase $+90°$, consists of resistors 1 and 2 and of capacitor C. Second amplifier V2, which is just downstream of phase-rotating network PH, is, as will be evident from the arrangement of resistors 3, 4, and 7 and transistors T2, T4, and T5, a differential amplifier with powerful common-mode rejection. First amplifier V1, which consists of resistors 5, 6, and 8 and of transistors T1, T3, and T6, is also a differential amplifier with powerful common-mode rejection. Variable amplifier SR, which consists of resistors 9 and 10 and of transistors T7, T8, T9, and T10, is symmetrical. A reference voltage $U_{V1}$ is applied to the mutually connected bases of transistors T5 and T6.

Since input signal $U_E$ is on the one hand conveyed to the bases of the transistors T1 and T3 in first differential amplifier V1, it can be picked up amplified but without phase shift at the collectors of transistors T1 and T3. Since input signal $U_E$ is on the other hand conveyed to the bases of the transistors T2 and T4 in second differential amplifier V2 through phase-rotating network PH, it can be picked up amplified and phase-shifted $+90°$ at the collectors of those two transistors.

Another reference voltage $U_{V2}$ is supplied to the bases of transistors T7 and T10 through resistor 9 and to the bases of transistors T8 and T9 through the equivalent resistor 10.

Since the two transistors T2 and T4 in second differential amplifier V2 operate in the push-pull mode, either only the emitters of transistors T7 and T8 or only those of transistors T9 and T10 are at reference potential through resistor 3 or 4, transistor T5, and resistor 7.

To facilitate comprehension of how variable amplifier SR works, the situation wherein transistor T4 is conducting and transistor T2 non-conducting will now be initially considered.

A control voltage $U_S$, which is applied to the mutually connected bases of transistors T8 and T9 through a variable switch S, excites either transistors T8 and T9 or transistors T7 and T10 because the two pairs are mutually push-pull. If control voltage $U_S$ is positive in relation to the voltage at the bases of transistors T7 and T10, transistors T9 and T8 will be excited and transistors T10 and T7 deactivated. The potential at output contact A2 is accordingly drawn toward reference potential, whereas the potential at output contact A1 will be U, even though transistor T8 is excited because transistor T2 is blocking differential amplifier V2. The more transistor T9 is excited, the more powerfully is the potential at output contact A2 attracted toward reference potential. The dimension of the signal at the output terminal of variable amplifier SR accordingly varies due to the variation in control voltage $U_S$. The signal's mathematical sign will reverse when control voltage $U_S$ becomes negative in relation to the potential at the bases of transistors T7 and T10, because at this voltage ratio, in contrast to the prescribed ratio, taansistors T7 and T10 will be excited and transistors T8 and T9 will block. The potential at output contact A1 will accordingly be attracted toward reference potential, whereas the potential at output contact A2 will be U, even though transistor T7 is excited because transistor T2 is blocking differential amplifier V2. The more transistor T10 is excited, the more powerfully is the potential at output contact A1 attracted toward reference potential. The dimension of the signal at the output terminal of variable amplifier SR accordingly varies due to the variation in control voltage $U_S$. Because, however, control voltage $U_S$ is now negative in relation to the potential at the bases of transistors T7 and T10, the sign of the signal at the output terminal of variable amplifier SR will now be the opposite of the sign in the previous case.

When the transistor T2 in differential amplifier V2 is conducting and transistor T4 non-conducting, the same situation will occur because control voltage $U_S$ will be positive in relation to the voltage at the bases of transistors T7 and T10, exciting transistors T9 and T8 and deactivating transistors T10 and T7. The potential at output contact A1 will accordingly be attracted toward reference potential, whereas the potential at output contact A2 will be U, even though transistor T9 is excited because transistor T4 is blocking differential amplifier V2. The more transistor T8 is excited, the more powerfully is the potential at output contact A1 attracted toward reference potential. The dimension of the signal at the output terminal of variable amplifier SR accordingly varies due to the variation in control voltage $U_S$. The signal's mathematical sign will reverse when control voltage $U_S$ becomes negative in relation to the potential at the bases of transistors T7 and T10, because at this voltage ratio, in contrast to the prescribed ratio, transistors T7 and T10 will be excited and transistors T8 and T9 will block.

The potential at output contact A2 will accordingly be attracted toward reference potential, whereas the potential at output contact A1 will be U, even though transistor T10 is excited because transistor T4 is blocking differential amplifier V2. The more transistor T7 is excited, the more powerfully is the potential at output contact A2 attracted toward reference potential. The dimension of the signal at the output terminal of variable amplifier SR accordingly varies due to the variation in control voltage $U_S$. Because, however, control voltage $U_S$ is now negative in relation to the potential at the bases of transistors T7 and T10, the sign of the signal at the output terminal of variable amplifier SR will now be the opposite of the sign in the previous case.

A particular advantage of this embodiment is that the voltage indicator illustrated in FIGS. 2 and 3 can be very precisely positioned at the midpoint of the regulating range by simple means, opening variable switch S. Because second reference voltage $U_{V2}$ will be at the bases of transistors T7, T8, T9, and T10 when variable switch S is open, the voltage indicator will come to rest precisely at its midpoint.

Th phase shifter in accordance with the invention is appropriate not only for regulating the chrominance in an NTSC color-television system but can also be employed to advantage in a PAL or SECAM decoder for example to automatically adjust the phase between FBAS-signal-to-direct and FBAS-signal-to-delay-line

I claim:

1. A circuit arrangement for shifting the phase of a signal, comprising: two parallel branches for conveying said signal in each branch; a phase-shifting network in one of said two branches for applying a constant phase shift to said signal when passing through said one of the two branches; and means in one of said branches for controlling the amplitude of said signal and inverting the polarity of said signal.

2. A circuit arrangement as defined in claim 1, including a variable amplifier in series with said phase-shifting network for controlling the amplitude of said signal and inverting the polarity of said signal.

3. A circuit arrangement as defined in claim 1, including a variable amplifier for controlling the amplitude of said signal and inverting the polarity of said signal, said phase-shifting network being connected in one branch and said variable amplifier being connected in the other of said two parallel branches.

4. a circuit arrangement as defined in claim 1, wherein said phase-shifting network shifts the phase through +90?.

5. A circuit arrangement as defined in claim 1, including an amplifier in each one of said two branches.

6. A circuit arrangement as defined in claim 5, wherein each amplifier comprises a differential amplifier.

7. A circuit arrangement for shifting the phase of a signal, comprising: two parallel branches for conveying said signal in each branch; a phase-shifting network in one of said two branches for applying a constant phase shift to said signal when passing through said one of the two branches; and means in one of said branches for controlling the amplitude of said signal and inverting the polarity of said signal; a variable amplifier connected in series with said phase-shifting network for controlling the amplitude of said signal and inverting the polarity of said signal, said phase-shifting network shifting the phase through $+90$ ; an amplifier connected in each of said two branches and comprising a differential amplifier.

8. A circuit arrangement for shifting the phase of a signal, comprising: two parallel branches for conveying said signal in each branch; a phase-shifting network in one of said two branches for applying a constant phase shift to said signal when passing through said one of the two branches; and means in one of said branches for controlling the amplitude of said signal and inverting the polarity of said signal; an amplifier in each branch, said amplifier comprising a differential amplifier; a first transistor with base connected to a first input terminal for said signal; a second transistor with base connected to said first input terminal through a first resistor; a third transistor with base connected to a second input terminal of said signal; a fourth transistor with base connected to said second input terminal through a second resistor; capacitor means connected between the base of said second transistor and the base of said fourth transistor; said second transistor having an emitter connected to the emitter of said fourth transistor through a series circuit comprising a third resittor and a fourth resistor; said third transistor having an emitter connected to the emitter of said first transistor through a series circuit comprising a fifth resistor and a sixth resistor; a fifth transistor with collector connected to a junction between said third resistor and said fourth resistor; a sixth transistor with collector connected to a junction between the fifth resistor and said sixth resistor; said fifth transistor having a base connected to the base of said sixth transistor; said fifth transistor having an emitter connected to a reference potential through a seventh resistor; said sixth transistor having an emitter connected to said reference potential through an eighth resistor; a seventh transistor and an eighth transistor with emitters connected together and to the collector of said second transistor; a ninth transistor and a tenth transistor with emitters connected together and to the collector of said fourth transistor; said seventh transistor having a base connected to the base of said tenth transistor; said eighth transistor having a base connected to the base of said ninth transistor; a series circut of a ninth resistor and a tenth resistor connecting the base of said seventh transistor to the base of said eighth transistor; said first transistor and said eighth transistor as well as said tenth transistor having collectors connected together and to a voltage source through an eleventh resistor; said third transistor and said seventh transistor as well as said ninth transistor having collectors connected together and to said voltage source through a twelfth resistor; collectors of said first transistor, eighth transistor and tenth transistor being connected together at a junction comprising a first output terminal; collectors of said third transistor, seventh transistor and ninth transistor being connected together at a junction comprising a second output terminal; a first reference voltage connected to the bases of said fifth transistor and said sixth transistor; a second reference voltage connected to a junction between said ninth resistor and said tenth resistor; and a source of control voltage connected to the bases of said eighth transistor and said ninth transistor.

* * * * *

UNITED STATES PATENT AND TRADEMARK OFFICE
CERTIFICATE OF CORRECTION

PATENT NO. : 4,792,744

DATED : December 20, 1988

INVENTOR(S) : Antoine Pery

It is certified that error appears in the above-identified patent and that said Letters Patent is hereby corrected as shown below:

Title page:

Item [19] "Antoine" should read --Pery--

[75] "Pery Antoine" should read --Antoine Pery--.

Signed and Sealed this

Twenty-seventh Day of June, 1989

Attest:

DONALD J. QUIGG

Attesting Officer

Commissioner of Patents and Trademarks